United States Patent
Ino et al.

(10) Patent No.: US 7,943,981 B2
(45) Date of Patent: May 17, 2011

(54) SEMICONDUCTOR MEMORY ELEMENT

(75) Inventors: Tsunehiro Ino, Fujisawa (JP); Naoki Yasuda, Yokohama (JP); Koichi Muraoka, Sagamihara (JP); Jun Fujiki, Yokohama (JP); Shoko Kikuchi, Kawasaki (JP); Keiko Ariyoshi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 12/233,073

(22) Filed: Sep. 18, 2008

(65) Prior Publication Data

US 2009/0212346 A1 Aug. 27, 2009

(30) Foreign Application Priority Data

Feb. 21, 2008 (JP) ................... 2008-039952

(51) Int. Cl.
*H01L 29/788* (2006.01)
(52) U.S. Cl. ................ 257/321; 257/E47.001
(58) Field of Classification Search .................. 257/321, 257/E47.001
See application file for complete search history.

(56) References Cited

U.S. PATENT DOCUMENTS

| | | | |
|---|---|---|---|
| 6,917,072 | B2 | 7/2005 | Noguchi et al. |
| 7,053,448 | B2 | 5/2006 | Jeon et al. |
| 2004/0251489 | A1 | 12/2004 | Jeon et al. |
| 2007/0296026 | A1 | 12/2007 | Jeon et al. |
| 2008/0217680 | A1 | 9/2008 | Shimizu et al. |
| 2008/0237688 | A1 | 10/2008 | Yasuda |
| 2008/0237697 | A1 | 10/2008 | Shimizu et al. |
| 2008/0237699 | A1* | 10/2008 | Shimizu et al. ............... 257/326 |
| 2009/0078990 | A1 | 3/2009 | Yasuda |

FOREIGN PATENT DOCUMENTS

| | | |
|---|---|---|
| EP | 1 487 013 A2 | 12/2004 |
| JP | 2004-165553 | 6/2004 |
| JP | 2005-5715 | 1/2005 |
| JP | 2005-268756 | 9/2005 |
| JP | 2007-273548 | * 10/2007 |

OTHER PUBLICATIONS

C. H. Lai, et al., "Very Low Voltage SiO$_2$/HfON/HfAlO/TaN Memory with Fast Speed and Good Retention", Symposium on VLSI Technology Digest of Technical Papers, 2006, pp. 1-2.

T. Sugizaki, et al., "Novel Multi-bit SONOS Type Flash Memory Using a High-k Charge Trapping Layer", Symposium on VLSI Technology Digest of Technical Papers, 2003, p. 27-28.

U.S. Appl. No. 12/880,748, filed Sep. 13, 2010, Ino et al.

* cited by examiner

*Primary Examiner* — David S Blum
(74) *Attorney, Agent, or Firm* — Oblon, Spivak, McClelland, Maier & Neustadt, L.L.P.

(57) ABSTRACT

A semiconductor memory element includes: a tunnel insulating film formed on a semiconductor substrate; a HfON charge storage film with Bevan clusters formed on the tunnel insulating film; a blocking film formed on the HfON charge storage film; and a gate electrode formed on the blocking film.

24 Claims, 6 Drawing Sheets

□ No Anion Site
○ Cation

SEMICONDUCTOR MEMORY ELEMENT

CROSS-REFERENCE TO RELATED APPLICATIONS

This application is based upon and claims the benefit of priority from the prior Japanese Patent Application No. 2008-039952, filed on Feb. 21, 2008; the entire contents of which are incorporated herein by reference.

BACKGROUND OF THE INVENTION

1. Field of the Invention

The present invention relates to a nonvolatile semiconductor memory element of which a charge storage layer is made of an insulating film.

2. Description of the Related Art

As one of memory structures related to a NAND type flash memory, a MONOS (metal/oxide/nitride/oxide/semiconductor) structure may be exemplified. With the MONOS structure, the interference between the adjacent cells can be suppressed.

The above-described MONOS structure of metal/oxide/nitride/oxide/semiconductor is a typical example. The MONOS structure is not limited in the structure of metal/oxide/nitride/oxide/semiconductor.

The MONOS type memory cell is characterized in that the charge storage layer is made of an insulating film. In the MONOS type memory cell, namely, a channel is formed between a source diffusion layer and a drain diffusion layer formed at a silicon substrate so that a tunnel insulating film, a silicon nitride film, a blocking film, and a gate are subsequently formed on the channel. In the writing/erasing operation, the charge is passed through the tunnel insulating film. The silicon nitride film functions as a charge storage film. The blocking film keeps a charge stored in the charge storage film.

Recently, the development of operation speed is required for the flash memory such as the MONOS type memory cell as described above. In this point of view, such an attempt is made as making the tunnel insulating film of the MONOS type memory cell of a silicon oxynitride (SiON) film with high dielectric constant and reducing the thickness of the SiON film so that the erasing speed can be developed and thus, the operation speed can be developed (Reference 1).

The development of capacity is also required for the flash memory in addition to the development of operation speed. In this point of view, such an attempt is made as making the charge storage layer of an insulating film with high dielectric constant (high-k) so as to increase the amount of charge to be stored in the charge storage layer instead of the silicon nitride film (Reference 2).

In a flash memory such as a MONOS type memory cell, however, the use of the insulating film with high dielectric constant can not develop the charge storage density of the flash memory sufficiently. The requirement of the development of memory capacity in the flash memory is not satisfied.

[Reference 1] JP-A 2004-165553 (KOKAI)

[Reference 2] T. Sugizaki, M. Kobayashi, M. Minakata, M. Yamaguchi, Y. Tamura, Y. Sugiyama, T. Nakanishi and H. Tanaka, "Novel Multi-bit SONOS Type Flash Memory Using a High-k Charge Trapping Layer," Symp. VLSI Tech. Digest p. 27 (2003).

BRIEF SUMMARY OF THE INVENTION

An aspect of the present invention relates to a semiconductor memory element, including: a tunnel insulating film formed on a semiconductor substrate; a HfON charge storage film with Bevan clusters formed on the tunnel insulating film; a blocking film formed on the HfON charge storage film; and a gate electrode formed on the blocking film.

Another aspect of the present invention relates to a HfON charge storage film for a semiconductor memory element comprising Bevan clusters.

DETAILED DESCRIPTION OF THE INVENTION

Hereinafter, the present invention will be described in detail with reference to the drawings.

(Structure of Semiconductor Memory Element)

Figure 1:
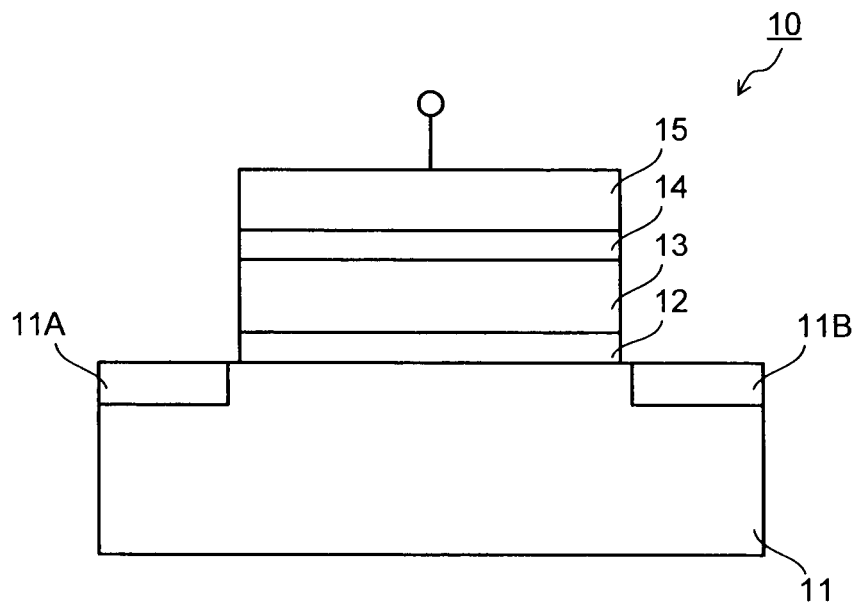
FIG. 1 is a cross sectional view showing the structure of a semiconductor memory element according to an embodiment.

FIG. 1 is a cross sectional view showing the structure of a semiconductor memory element according to an embodiment. As shown in FIG. 1, in the semiconductor memory element 10 in this embodiment, a tunnel insulating film 12, a charge storage film 13, a blocking film 14 and a gate electrode 15 are subsequently formed on a semiconductor substrate 11. Then, a source region 11A and a drain region 11B are formed in the semiconductor substrate 11 at both sides of the thus obtained stacking structure made of the tunnel insulating film 12 and the like.

The semiconductor substrate 11 may be made of a silicon substrate commercially available, and the tunnel insulating film 12 may be made of a SiON tunnel insulating film. The combination of the silicon substrate and the SiON tunnel insulating film can enhance the tunneling effect of the tunnel insulating film 12 for charges (electrons) to be stored.

The charge storage film 13 may be made of HfON. The blocking film 14 may be made of at least one selected from the group consisting of alumina ($Al_2O_3$), aluminum oxynitride (AlON), hafnium aluminate (HfAlO), lanthanum aluminate (LaAlO), hafnium silicon oxynitride (HfSiON) and hafnia (HfO$_2$). The gate electrode 15 may be made of at least one selected from the group consisting of tantalum nitride (TaN), niobium nitride (NbN), titanium nitride (TiN), hafnium nitride (HfN), zirconium nitride (ZrN), tantalum silicon nitride (TaSiN), tantalum silicide (TaSix), ruthenium (Ru), tungsten (W), tungsten silicide (WSix), tantalum carbide (TaC), titanium carbide (TiC), hafnium carbide (HfC), zirconium carbide (ZrC), tungsten carbide (WC), tantalum boride (TaBx), titanium boride (TiBx), zirconium boride (ZrBx), ruthenium oxide (RuOx), rhenium oxide (ReOx), strontium ruthenate (SrxRuyOz) and niobium-doped strontium titanate (SrTi$_{1-x}$Nb$_x$O$_3$). Namely, the gate electrode 15 may be made of a material with high electric conduction and high melting point. In this way, the semiconductor memory element 10 can be configured as a so-called MONOS type flash memory (cell).

The silicon substrate 11 may be set to a p-type silicon substrate, and the source/drain regions 11A and 11B may be set to n-type regions, respectively.

In this embodiment, it is required that the HfON charge storage film 13 contains Bevan clusters partially or entirely. In this case, since the HfON charge storage film 13 can have a plurality of anion defect sites therein, the HfON charge storage film 13 can trap a number of charges. Therefore, the charge storage density of the HfON charge storage film 13 can be enhanced so that the memory capacity of the semiconductor memory element 10 shown in FIG. 1 can be also enhanced.

Fundamentally, the Bevan cluster structure contains fluorite structure and defects at the anion sites thereof.

The fluorite structure is defined as follows: The coordinate values (x, y, z) in space coordinates for anions to be located can be represented by the equation of x=2l+1, y=2m+1, and z=2n+1 (l, m, and n: integer number), that is, odd number, respectively. The coordinate values (x, y, z) in space coordinates for cations to be located can be represented by the equation of x=2p, y=2q, and z=2r (p, q, and r: integer number), that is, even number, respectively. With the cations, moreover, the relation of x+y+Z=4s (s: integer number) is also required for the coordinate values (x, y, z). In other words, it is required that the summation of coordinate numbers x, y, z is set to four or multiples of four. Herein, the relative angles between the coordinate axes x, y, z are not always to 90 degrees, respectively and the unit lengths along the coordinate axes x, y, z are not always set equal to one another.

In this point of view, the fluorite structure has a hexahedral structure with six convex quadrilateral faces such that one cation is located at the center of the hexahedral structure with six convex quadrilateral faces and eight anions are located at the vertices of the hexahedral structure with six convex quadrilateral faces. Moreover, the fluorite structure has another hexahedral structure with six convex quadrilateral faces such that eight anions are located at the vertices of the additional hexahedral structure with six convex quadrilateral faces and no cation is located at the center of the additional hexahedral structure with six convex quadrilateral faces. In this case, the previous hexahedral structure with six convex quadrilateral faces with the cation at the center thereof has a common face and four common vertices with the additional hexahedral structure with six convex quadrilateral faces with no cation at the center thereof. In other words, the fluorite structure is configured such that a plurality of hexahedral structure with six convex quadrilateral faces with cation at the center thereof and a plurality of hexahedral structure with six convex quadrilateral faces with no cation at the center thereof are arranged in checkered pattern.

The unit structure of Bevan cluster is configured such that one six-coordinate cation (metallic element) located at the center thereof is surrounded by six seven-coordinate cations (metallic elements) and two vacancies are formed at the lattice sites (anion sites) on the diagonal line thereof (e.g., [111] direction) (refer to J. solid State Chemistry 1, 536-544 (1970), M. R. Thornber & D. J. M. Bevan). Concretely, the Bevan cluster structure can be shown as FIG. 2.

Figure 2:
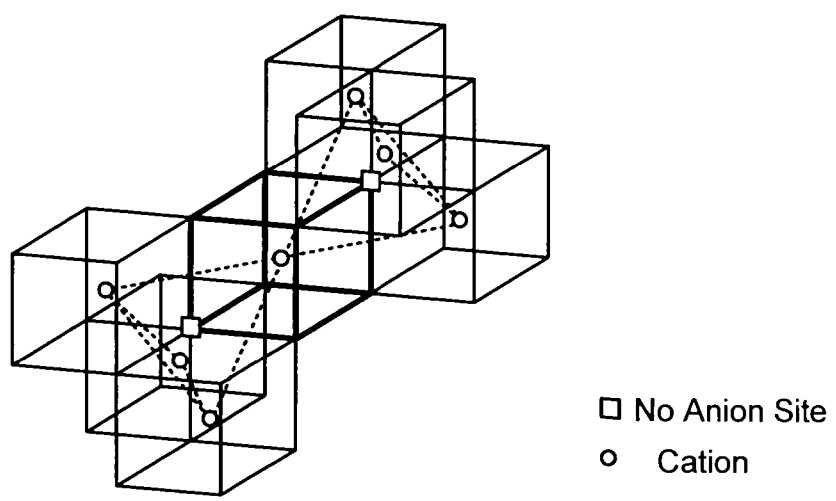
FIG. 2 is a schematic view showing the structure of a Bevan cluster type crystal.

As shown in FIG. 2, the anions are located at the vertices of the hexahedral structure with six convex quadrilateral faces, and no anion is located at the vertices thereof designated by the symbol of quadrangle (hereinafter referred to as V) and the cations are located at the positions thereof designated by the symbol of circular shape (hereinafter referred to as M). In FIG. 2, only one Bevan cluster is shown. In the real charge storage film, however, more Bevan clusters may be contained. For example, a plurality of Bevan clusters may be provided so as to be adjacent to one another. In this case, all of the Bevan clusters can be set equal to one another, but one or more of the Bevan clusters can be set different from the others thereof. For example, one or more of the equal or not equal Bevan clusters or the fluorite clusters may be adjacent to the Bevan cluster, where the fluorite cluster represented by the general equation of Hf$_7$O$_{14}$ which is almost the same as the Bevan cluster but the anions are also located at the positions designated by the symbol "V", which is the vacant position in the case of Bevan cluster.

In real, the charge storage film may contain the Bevan clusters and/or the fluorite clusters. In this case, only the edges of the hexahedron positioned at the center of the Bevan cluster may be shared with only the edges of the outer six hexahedrons in the corresponding Bevan cluster and also only the edges of the six hexahedrons in the adjacent Bevan cluster or fluorite cluster. In this case, all of the twelve edges of the hexahedron positioned at the center of the Bevan cluster are shared with the adjacent Bevan clusters and/or fluorite clusters.

Preferably, the HfON charge storage film 13 has a crystal structure belonging to rhombohedral space group No. 148, -R3 (hereinafter, "-" means a symbol to be positioned on the top of the number "3" located backward from the symbol) or rhombohedral space group No. 147, -P3 (hereinafter, "-" means a symbol to be positioned on the top of the number "3" located backward from the symbol). More preferably, the HfON charge storage film 13 has a crystal structure belonging to rhombohedral space group No. 148, -R3. In this case, the charge fixing function of the HfON charge storage film 13 is enhanced and thus, the charge storage performance is also enhanced so that the shielding effect for the charges stored in the HfON charge storage film 13 can be enhanced. In this point of view, the charge storage density of the HfON charge storage film 13 can be enhanced. Moreover, the stability of the HfON charge storage film 13, that is, the stability of semiconductor storage element 10 can be enhanced.

Namely, if the HfON charge storage film 13 has a crystal structure belonging to rhombohedral space group No. 148, -R3 and/or rhombohedral space group No. 147, -P3, the Bevan clusters and the fluorite Hf$_7$O$_{14}$ clusters are alternately stacked in layer so that the HfON charge storage film 13 can exhibit the above-described function/effect. As described previously, the fluorite Hf$_7$O$_{14}$ clusters can be configured such that no anion defect is formed, which the anion defect is designated by the symbol "V" in this text and by the symbol of quadrangle in FIG. 2 although the fluorite Hf$_7$O$_{14}$ cluster is similar to the Bevan cluster shown in FIG. 2. This fluorite cluster contains no anion defects. In contrast, fluorite structure may contain anion defects. That is, fluorite structure is composed of Bevan clusters and/or fluorite clusters. A Bevan cluster or a fluorite cluster contains seven cation sites and fourteen anion sites.

Note that the chain structure of —V-M-V—C—V-M-V—C—V-M-V—C— ... is formed linearly so as to connect two anion defect sites when the HfON charge storage film 13 contains only the Bevan clusters. Herein, the symbol "C" means the center site of the hexahedron of fluorite structure with no cation. The chain structure contains only metallic elements and no anion. Therefore the electron conduction barrier of the chain structure becomes lower and it may be that the HfON charge storage film 13 can not store electrons sufficiently. In this case, the HfON charge storage film 13 can not exhibit the charge storage function.

In contrast, when the HfON charge storage film 13 contains the Bevan clusters and the fluorite $Hf_7O_{14}$ clusters, the chain structure of —V-M-V—C—S-M-S—C— ... can be formed instead of the chain structure of —V-M-V—C—V-M-V—C—V-M-V—C— .... Herein, the symbol "S" means an anion site, and the first four of the —V-M-V—C—S-M-S—C— ... chain consists of the Bevan cluster and the last four consists of the fluorite cluster. In this case, since the anions of the fluorite structure exist on the chain structure, the fluorite $Hf_7O_{14}$ clusters can function as blocking layers so as to block the electrons trapped at the anion defects of the Bevan clusters.

Therefore, the charge fixing function of the Bevan cluster is enhanced and thus, the charge storage capacity for the Bevan cluster can be carried out stably. As a result, the charge storage performance of the HfON charge storage film 13 is enhanced and the stability of the semiconductor storage element 10 is also enhanced. Moreover, the charge storage density of the HfON charge storage film 13 can be enhanced.

In the case that the HfON charge storage film 13 has a crystal structure belonging to rhombohedral space group No. 148, -R3 or rhombohedral space group No. 147, -P3, the composition of the HfON charge storage film 13 can be represented by $Hf_7O_{2(4n+3)/n}N_{4(n-1)/n}$ (n: a natural number greater than or equal to two). Typically, the HfON charge storage film 13 can have the composition of $Hf_7O_{11}N_2$ (n=2) or $Hf_7O_8N_4$ (n=∞).

The nitrogen content of the HfON charge storage film 13 is preferably set with in a range of 0.5 to 21 at. %, more preferably within a range of 5 to 13 at. %, particularly within a range of 9 to 11 at. %. If the HfON charge storage film 13 has the nitrogen content as described above, the HfON charge storage film 13 can easily shows crystal structure which belongs to the space group as described above.

For Example, in the case that the nitrogen content of the HfON charge storage film 13 is set within a range of 9 to 11 at. %, the HfON charge storage film 13 shows crystal structure which belongs to rhombohedral space group No. 148, -R3 and exhibits the composition of the $Hf_7O_{11}N_2$. In this case, the $Hf_7O_{11}N_2$ shows the structure that the Bevan cluster structure and the fluorite $Hf_7O_{14}$ cluster structures are alternately stacked in layer as described previously.

Some portions of the HfON charge storage film 13 may be amorphous. The charge storage performance of the HfON charge storage film 13 decreases as the ratio of amorphous structure in the HfON charge storage film 13 increases. However, since the amorphous structures of the HfON charge storage film 13 can exhibit the charge storage function to some degrees, which is smaller than the charge storage function of the above described structure of the HfON charge storage film 13, the HfON charge storage film 13 can exhibit practical charge storage performance to some degrees under the condition that the ratio of amorphous structure in the HfON charge storage film 13 is large. In contrast, if the HfON charge storage film 13 does not contain the Bevan clusters or the fluorite $Hf_7O_{14}$ clusters, the HfON charge storage film 13 can not exhibit practical charge storage performance because the charge storage performance decreases by order of magnitude.

If the nitrogen content of the HfON charge storage film 13 becomes smaller than the range of 9 to 11 at. %, the HfON charge storage film 13 results in containing $HfO_2$ crystal belonging to monoclinic space group No. 14, $P2_1/C$. The monoclinic $HfO_2$ of the HfON charge storage film 13 can exhibit the charge storage function to some degrees, but it is smaller than the charge storage function of the rhombohedral HfON of the HfON charge storage film 13. So the charge storage performance of the HfON charge storage film 13 moderately decreases as the ratio of the monoclinic $HfO_2$ increases and the ratio of the rhombohedral HfON decreases in the HfON charge storage film 13.

If the nitrogen content of the HfON charge storage film 13 is set to 0.5 at. % or more, the HfON charge storage film 13 can exhibit the practical charge storage performance sufficiently because the HfON charge storage film 13 has the crystal structures belonging to rhombohedral space group No. 148, -R3 to some degrees.

Moreover, if the nitrogen content of the HfON charge storage film 13 becomes larger than the range of 9 to 11 at. %, the crystal structure of the HfON charge storage film 13 can be maintained to belong to rhombohedral space group No. 148, -R3 or rhombohedral space group No. 147, -P3 until the nitrogen content of 21 at. %, but the ratio of Bevan cluster increases and the ratio of fluorite $Hf_7O_{14}$ cluster decreases. Therefore, since the Bevan clusters are adjacent to one another at high rates, the number of the chain structure of —V-M-V—C—V-M-V—C—V-M-V—C— ... increases so that the charge blocking function may decrease. If the nitrogen content of the HfON charge storage film 13 is greater than 21 at. %, the HfON charge storage film 13 contains only the Bevan clusters and no fluorite $Hf_7O_{14}$ clusters. In this case, the chain structure of —V-M-V—C—V-M-V—C—V-M-V—C— ... has low electron conduction barrier decreases in energy, but the barrier is too low to maintain charge in the HfON charge storage film, so that it may be that the HfON charge storage film 13 can not be employed practically.

In this case, the ratio of fluorite $Hf_7O_{14}$ cluster decreases to smaller than half in the HfON charge storage film 13. The crystal structure of HfON charge storage film 13 is an intermediate structure of rhombohedral $Hf_7O_{11}N_2$ space group No. 148, -R3 which includes 1:1 ratio of fluorite $Hf_7O_{14}$ clusters and the Bevan clusters and rhombohedral $Hf_7O_8N_4$ space group No. 148, -R3 which includes no fluorite $Hf_7O_{14}$ clusters but only the Bevan clusters. In this case, the crystal structures of rhombohedral space group No. 148, -R3 or the crystal structures of rhombohedral space group No. 147, -P3 appears alternately with the increase of nitrogen content. The appearance ratio of the rhombohedral crystal space group No. 148, -R3 and rhombohedral crystal space group No. 147, -P3 becomes 2:1 on an average.

That is, the rhombohedral crystal space group No. 148 is the main phase of HfON in one component of nitrogen, and the rhombohedral crystal space group No. 147 is the main phase of HfON in another component of nitrogen. The wording "main phase" means the existence of impurity phase different from the inherent crystal structures contained in the HfON charge storage film 13 in view of second law of thermodynamics which dictates the existence of impurity phase caused by the fluctuation in nitrogen content in the HfON charge storage film 13. Herein, the impurity phase belongs to rhombohedral space group No. 148, -R3 or rhombohedral space group No. 147, -P3. Even in view of the existence of the impurity phase, the averaged appearance ratio as previously described between the crystal structure of rhombohedral space group No. 148, -R3 and the crystal structure of rhombohedral space group No. 147, -P3 becomes also 2:1 on the average after weighted by the mixed ratio of the main phase and the impurity phase.

In this case, since the crystal structures related to rhombohedral space group No. 148, -R3 or the crystal structures related to rhombohedral space group No. 147, -P3 appear alternately, the anion defect sites of the crystal structures become to arrange in the vicinity each other. Therefore, the shielding effect for the charges trapped at the anion defect sites becomes low so that the charge fixing function also becomes low and thus, the charge storage performance also becomes low.

However, if the nitrogen content of the HfON charge storage film 13 is set within a range of 0.5 to 21 at. %, the HfON charge storage film 13 can exhibit a relatively high charge storage density and charge storage performance because the HfON charge storage film 13 has a crystal structures belonging to rhombohedral space group No. 148, -R3 and rhombohedral space group No. 147, -P3.

If the nitrogen content of the HfON charge storage film 13 is greater than 21 at. %, $Hf_2ON_2$ crystals related to C-type rare earth oxide structure which belongs to cubic space group No. 206, -Ia3 (hereinafter, "-" means a symbol to be positioned on the top of the number "3" located backward from the symbol) is the main phase of the HfON. In the $Hf_2ON_2$ crystal, a cation is located at the center of the hexahedral structure with six convex quadrilateral faces of the fluorite structure and two anion defect sites are located at the vertices of the hexahedral structure with six convex quadrilateral faces thereof so that one of the anion defect sites interacts with the other of the anion defect sites through the d orbital of the cation located at the center thereof.

In the case that the HfON charge storage film 13 contains only the Bevan clusters, since the chain structure of —V-M-V—C—V-M-V—C—V-M-V—C— . . . is formed in the HfON charge storage film 13 so that the electron conduction barrier becomes low to some degrees in energy due to the space separation of the site with no cation designated by the symbol "C". In the case that the HfON charge storage film 13 is contains mainly the $Hf_2ON_2$ crystal, since the chain structure of —V-M-V—C—V-M-V—C—V-M-V—C— . . . is formed in the HfON charge storage film 13 so that the electron conduction barrier becomes extremely low in energy due to the d orbital chain. Therefore, once a charge is trapped at the anion defect site in one $Hf_2ON_2$ crystal, the charge is easily shifted at the anion defect site in the adjacent $Hf_2ON_2$ crystal. In this point of view, the charge storage performance of the HfON charge storage film 13 decreases as the ratio of the $Hf_2ON_2$ crystal increases. As a result, it is desired that the nitrogen content of the HfON charge storage film 13 is set within a range of 0.5 to 21 at. % in view of the practical use of the HfON charge storage film 13.

Herein, the nitrogen content of the HfON charge storage film 13 is defined in view of that the general composition formula of HfON can be represented by $(HfO_2)x(Hf_3N_4)y$. In this case, the nitrogen content can be defined as 4y. Since $(HfO_2)x(Hf_3N_4)y$ is the general composition formula, the summation of all of the atomic ratios can be set to "1". In this case, the relation of x+3y (refer to Hf)+2x (refer to O)+4y (refer to N)=1 can be satisfied. Therefore, if the nitrogen content is defined as described above, the Hf content and the oxygen content can be also defined.

In the semiconductor memory element 10 in this embodiment, Hf can be contained in the SiON tunnel insulating film 12. In this case, since the dielectric constant of the SiON tunnel insulating film 12 can increase, the insulating feature of the SiON tunnel insulating film 13 can be enhanced so that the charge storage performance of the HfON charge storage film 13, that is, the semiconductor memory element 10 can be enhanced. The Hf can be contained in the SiON tunnel insulating film 12 by means of thermal diffusion through the thermal treatment at 950° C. or more after the HfON charge storage film 13 is formed.

The upper limited value of the thermal treatment may be set to 1100° C. so as not to degrade the semiconductor memory element 10 as a whole.

The semiconductor memory element 10 in this embodiment can be manufactured as follows. First of all, the (100) faced silicon substrate 11 is washed with dilute hydrofluoric acid so as to remove the natural oxide film formed at the surface of the silicon substrate. Then, the SiON tunnel insulating film 12 is formed on the silicon substrate 11 by means of thermal nitriding, CVD (Chemical vapor deposition), thermal treatment or the combination thereof. With the thermal nitriding, a $SiO_2$ film is nitrided. With the CVD, a SiN film is oxidized.

Then, the HfON charge storage film 13 is formed on the SiON tunnel insulating film 12 by means of sputtering or CVD. Alternatively, the HfON charge storage film 13 may be formed by nitriding a $HfO_2$ film, oxidizing a HfN film, oxidizing and nitriding a Hf film or oxynitriding a Hf film. Herein, the forming methods for the HfON charge storage film 13 may be independently employed respectively or two or more of the forming methods may be combined one another.

Then, the blocking film 14 and the gate electrode 15 are subsequently formed on the HfON charge storage film 13, and impurities are doped in the surface layer of the silicon substrate 11 at both sides of the thus obtained stacking structure made of the SiON tunnel insulating film 12 through the gate electrode 15 so as to form the source region 11A and drain region 11B.

In writing operation for the semiconductor memory element 10 in this embodiment, a positive voltage is applied to the gate electrode 15. In this case, charges (electrons) in a current passing between the source region 11A and the drain region 11B of the silicon substrate 11 are incorporated into the HfON charge storage film 13 via the SiON tunnel insulating film 12, trapped at the anion defect sites of the the HfON charge storage film 13, and stored therein.

In erasing operation for the semiconductor memory element 10 in this embodiment, a positive voltage is applied to the source region 11A or the drain region 11B. In this case, charges (electrons) stored in the HfON charge storage film 13 are discharged into the silicon substrate 11 via the SiON tunnel insulating film 12. In this way, the erasing operation is conducted.

Figure 3:
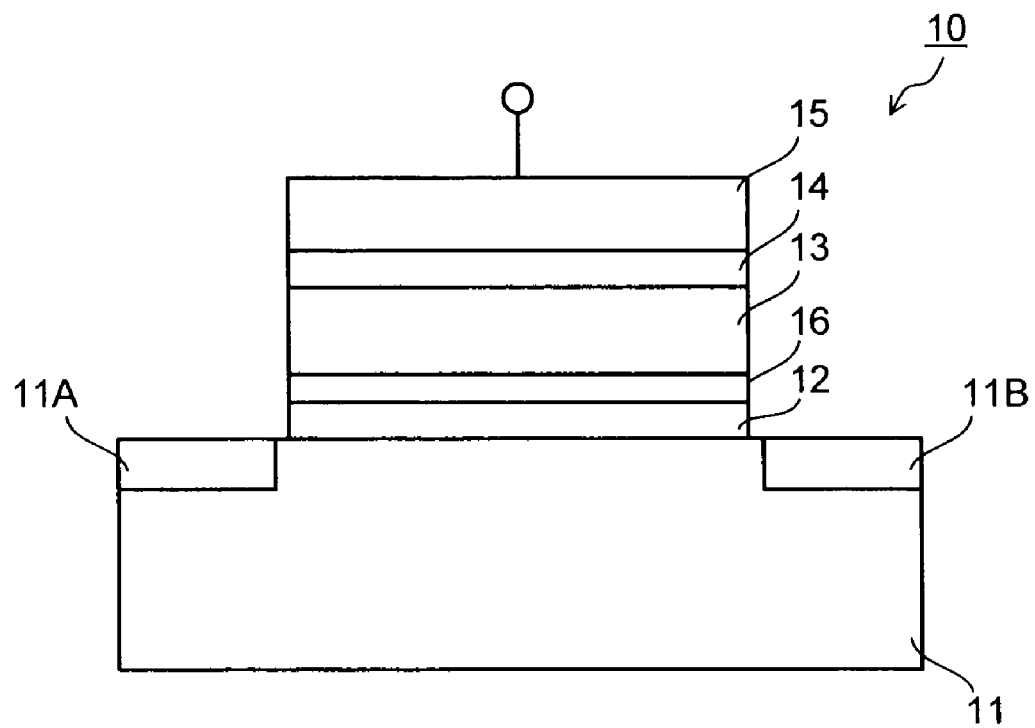
FIG. 3 is a cross sectional view showing the structure of a semiconductor memory element according to another embodiment.

FIG. 3 is a cross sectional view showing the structure of a semiconductor memory element according to a modified embodiment. Like or corresponding components are designated by the same reference numerals.

As shown in FIG. 3, in the semiconductor memory element 10 in this embodiment, a $Hf_xSi_{1-x}ON$ film (0<X<1) 16 is formed between the SiON tunnel insulating film 12 and the HfON charge storage film 13. In the $Hf_xSi_{1-x}ON$ film 16, the Hf component and the nitrogen component increase to the HfON charge storage film 13 from the SiON tunnel insulating film 12.

Since the $Hf_xSi_{1-x}ON$ film 16 has a large dielectric constant, the $Hf_xSi_{1-x}ON$ film 16 can compensate for the tunnel insulating function of the SiON tunnel insulating film 12. Moreover, since the Hf content and the nitrogen content of the $Hf_xSi_{1-x}ON$ film 16 are set smaller at the side of the SiON tunnel insulating film 12, the $Hf_xSi_{1-x}ON$ film 16 can reduce the low electric field current leak.

The characteristics of the semiconductor memory element 10 in this embodiment are required in the same manner as the ones of the semiconductor memory element 10 related to FIG. 1 except that the $Hf_xSi_{1-x}ON$ film 16 is additionally formed. Concretely, it is required that the HfON charge storage film 13 has the Bevan clusters, for example.

(Structure of Semiconductor Memory Device)

Figure 4:
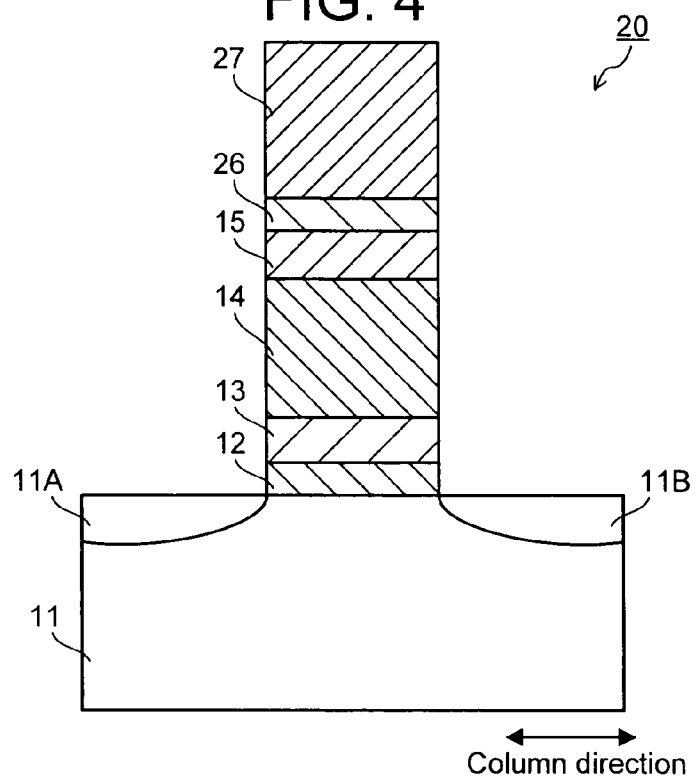
FIG. 4 is a cross sectional view showing the structure of a semiconductor memory device as viewed from the direction along the channel length thereof according to an embodiment.
Figure 5:
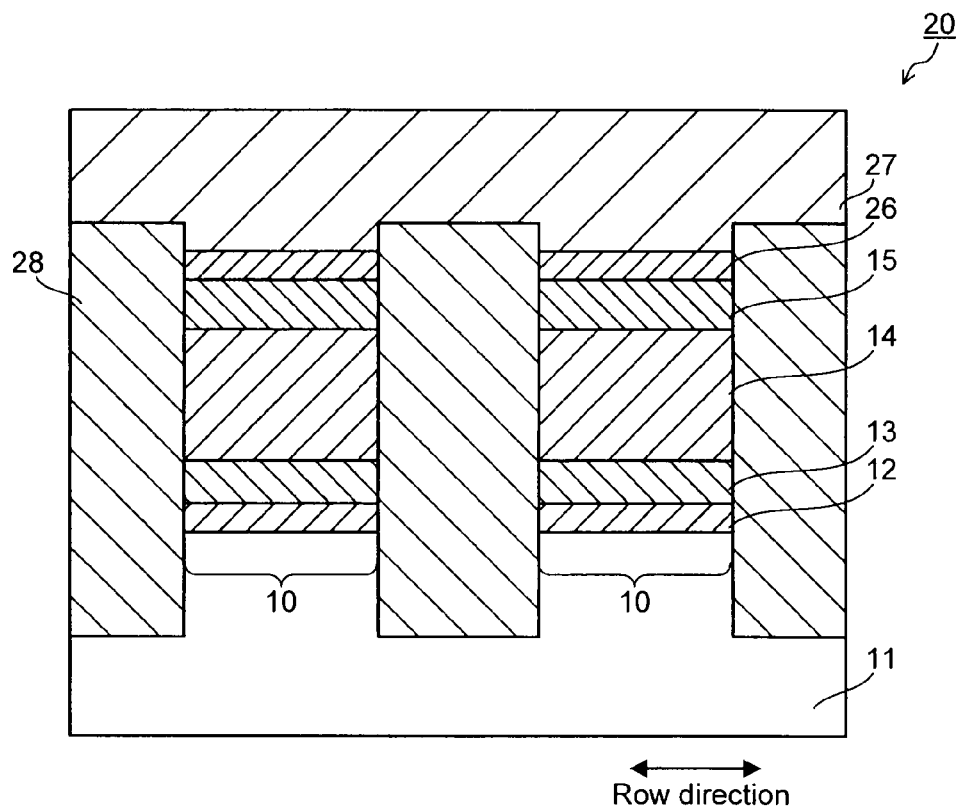
FIG. 5 is a cross sectional view showing the structure of the semiconductor memory device in FIG. 4 as viewed from the direction along the channel width thereof.

Then, a semiconductor memory device with the semiconductor memory element as described above will be described. FIG. 4 is a cross sectional view showing the structure of the semiconductor memory device 20 as viewed from the direction along the channel length thereof. FIG. 5 is a cross sectional view showing the structure of the semiconductor memory device 20 in FIG. 4 as viewed from the direction along the channel width thereof.

As shown in FIGS. 4 and 5, the semiconductor memory device 20 in this embodiment includes a barrier metallic film 26 formed on the gate electrode 15 of the semiconductor memory element 10 and a low resistance metallic film 27 formed on the barrier metallic film 26. The low resistance metallic film 27 functions as a wiring layer for applying a gate voltage to the gate electrode 15, and made of tungsten (W). The barrier metallic film 26 may be omitted as occasion demands.

As shown in FIG. 5, the plurality of semiconductor memory elements 10 are formed so as to be electrically separated from one another by trench-type element separating insulating films 28 in the direction along the channel width of the semiconductor memory device 20. Herein, the low resistance metallic film 27 forming the wiring layer is formed uniformly under the condition of no separation by the element separating insulating films 28.

The semiconductor memory device 20 shown in FIGS. 4 and 5 can be manufactured in the same manner as a normal STI (shallow trench isolation) structured semiconductor memory device. Namely, the step of forming the barrier metallic film 26 and the low resistance metallic film 27, the step (etching step) of forming trenches for the element separating insulating films 28 and the step of forming the element separating insulating films 28 so as to embed the trenches are simply added to the step of forming the semiconductor memory element 10. In this case, the trench-forming step and the element separating insulating film-forming step are conducted between the barrier metallic film-forming step and the low resistance metallic film-forming step.

EXAMPLE

First of all, the (100) faced silicon substrate was washed with dilute hydrofluoric acid so as to remove the natural oxide film formed at the surface of the silicon substrate. Then, the $SiO_2$ tunnel insulating film was formed on the silicon substrate by means of thermal oxidation. Then, the HfON charge storage film was formed on the $SiO_2$ tunnel insulating film by means of chemical sputtering. Herein, the composition of the HfON charge storage film was varied. In this case, the $N_2$ introduced during the chemical sputtering is activated by the sputtering plasma and implanted into the $SiO_2$ tunnel insulating film so that the $SiO_2$ tunnel insulating film was converted into the SiON tunnel insulating film. Then, the $Al_2O_3$ blocking film and the highly doped polycrystalline Si gate electrode were formed on the HfON charge storage film by means of CVD. Then, P (Phosphorus) was doped into the silicon substrate so as to form the source region and the drain region. In this case, thermal treatment and/or oxidation treatment and/or reduction treatment may be conducted for each or some of the films.

The thickness of the HfON charge storage film was set to 2.5 nm, 1.4 nm or 0.7 nm by equivalent oxide thickness (EOT). As will described hereinafter, the composition of the HfON charge storage film is referred to the nitrogen content (atomic ratio).

Figure 6:
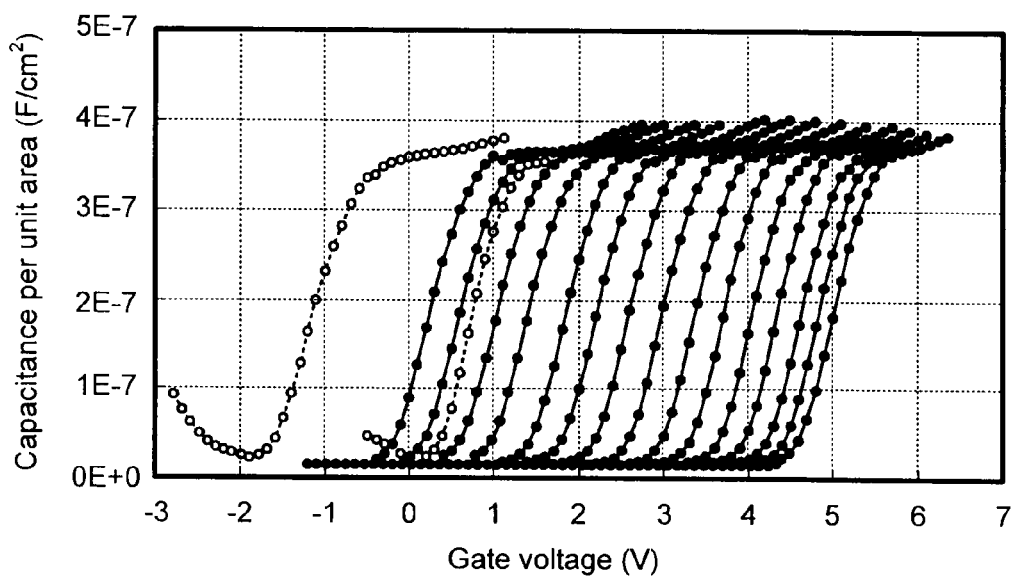
FIG. 6 is a graph showing the capacitance-voltage characteristics of a semiconductor memory element in Example.

Then, an erasing voltage of 10 V was applied to the thus obtained semiconductor memory element (nitrogen content=0.5 at. %) during one second and a writing voltage of 10 V was applied to the semiconductor memory element for various periods of time. Then, the change of capacitance with voltage, that is, the CV characteristic of the semiconductor memory element was measured. The thus obtained result was shown in FIG. 6. As shown in FIG. 6, it was turned out that the semiconductor memory element can exhibit satisfactory CV characteristics irrespective of the amplitude of the voltage to be applied to the gate electrode.

Figure 7:
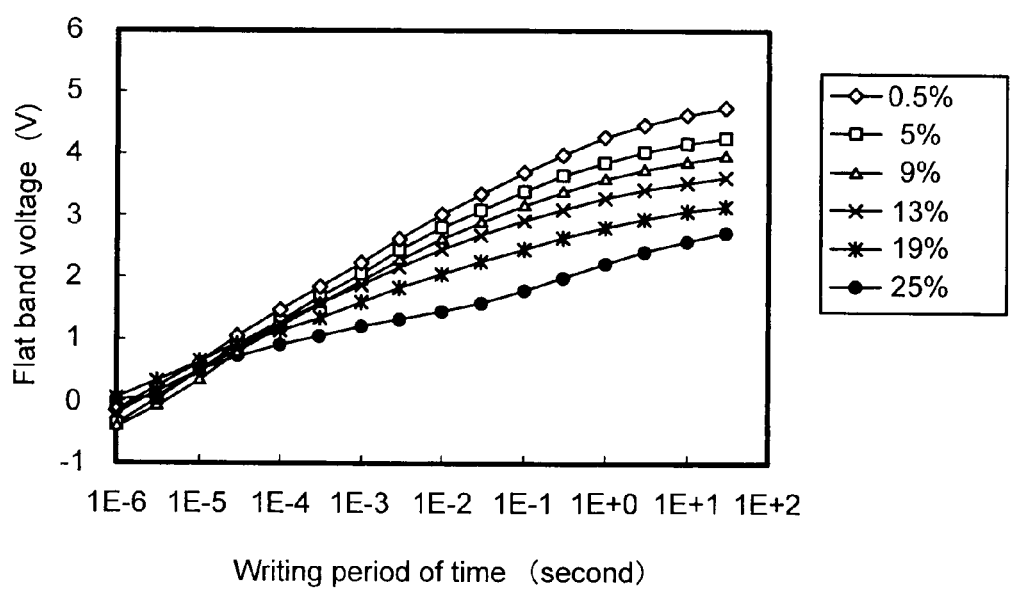
FIG. 7 is a graph showing the change of flat band voltage for writing period of time in the semiconductor element in Example.

FIG. 7 is a graph showing the change of flat band voltage for writing periods of time in the semiconductor element. As apparent from FIG. 7, the flat band voltage monotonically decreases as the nitrogen content increases.

Figure 8:
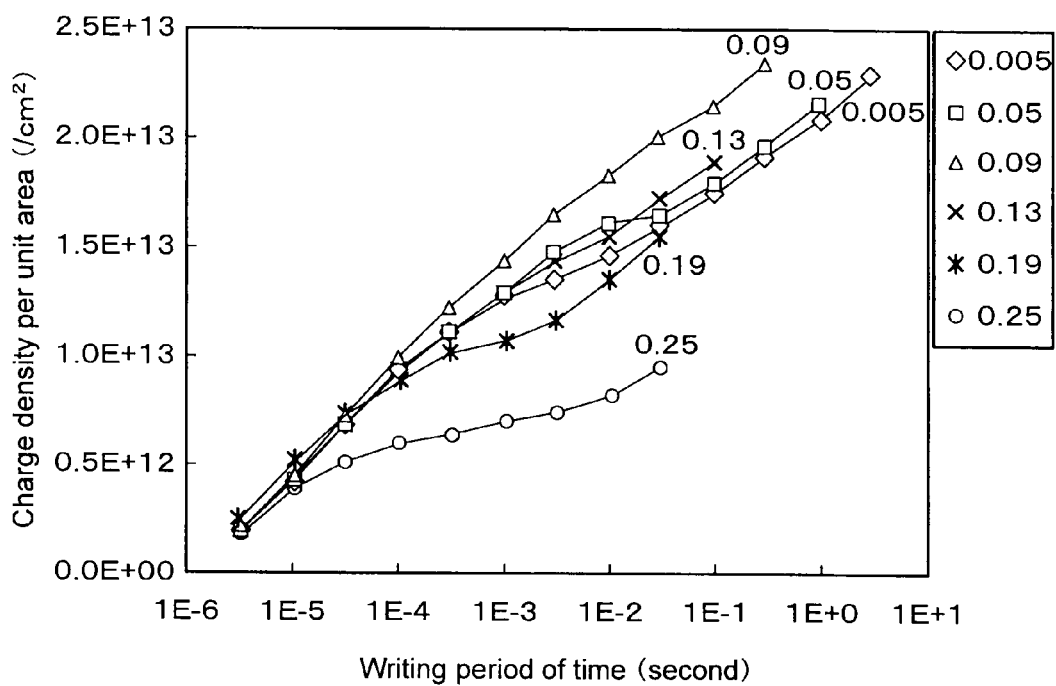
FIG. 8 is a graph showing the charge storage density for writing period of time in the semiconductor element in Example.

FIG. 8 is a graph showing the charge storage density for writing period of time in the semiconductor element. As apparent from FIG. 8, the charge storage density for writing period of time monotonically increases with a nitrogen content from 0.5 to 9 at. % and monotonically decreases with a nitrogen content form 9 to 25 at. %. Moreover, the charge storage density becomes large within a nitrogen content range of 5 to 13 at. %, particularly at 9 at. %.

Figure 9:
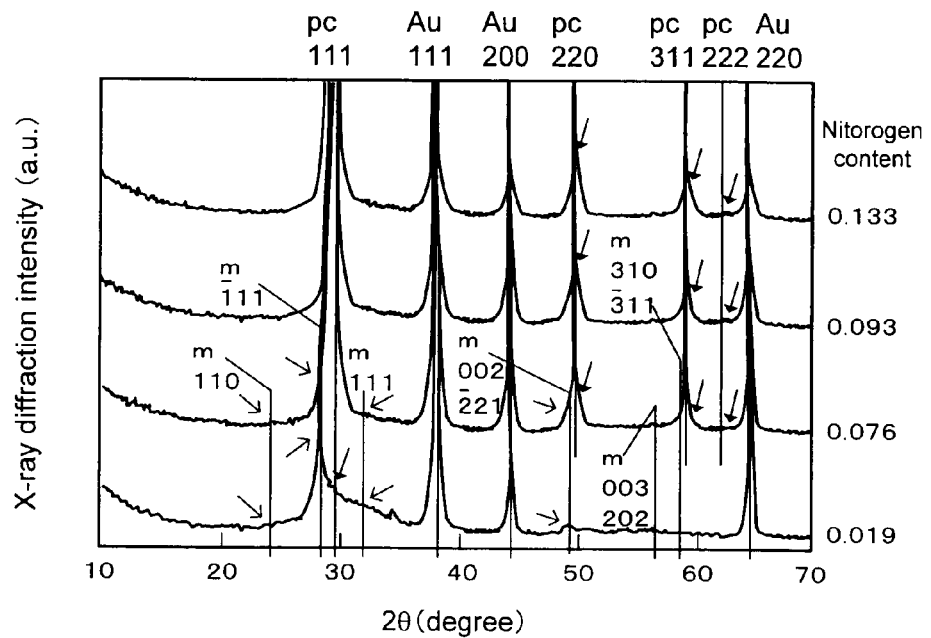
FIG. 9 relates to X-ray profiles, obtained through experiment, of the HfON charge storage film of the semiconductor memory element in Example.
Figure 10:
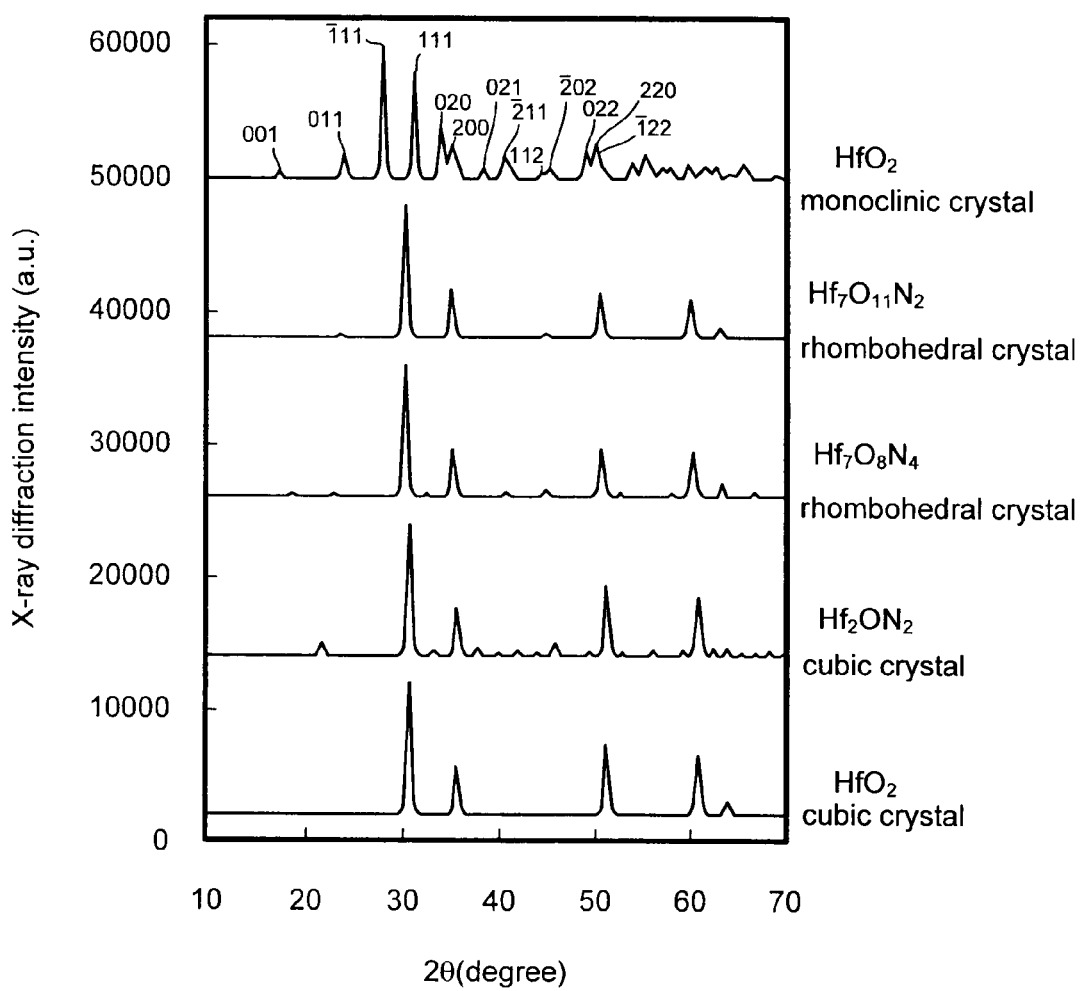
FIG. 10 relates to X-ray profiles of the HfON charge storage film of the semiconductor memory element in Example, the X-ray profiles being obtained through the calculation under the condition that the crystal structures of the HfON are supposed.

FIG. 9 relates to X-ray diffraction profiles of the HfON charge storage film of the semiconductor memory element with various nitrogen contents. FIG. 10 relates to X-ray diffraction profiles of $HfO_2$ crystal belonging to monoclinic space group No. 14, $P2_1/C$, $Hf_7O_{11}N_2$ crystal and $Hf_7O_8N_4$ crystal belonging to rhombohedral space group No. 148, -R3 and $Hf_2ON_2$ crystal belonging to cubic space group No. 206, -Ia3.

In FIG. 9, "Au" means Au elements existing around the semiconductor memory element at the measurement, and "111" and the like mean the corresponding (111) diffraction peak and the like of the Au elements. On the other hand, "pc"s mean diffraction peaks of the rhombohedral crystal indexed by pseudo-cubic. Namely, since the X-ray diffraction of the rhombohedral crystal coincides with the X-ray diffraction of the cubic crystal except some minute peaks originated from superlattice thereof, in FIG. 9, the rhombohedral crystal is substituted with the cubic crystal through the index by pseudo-cubic for simplicity.

As shown in FIGS. 9 and 10, when the nitrogen content of the HfON charge storage film is set to 1.9 at. % less than 5 at. %, the HfON charge storage film is almost constituted from the monoclinic crystal while the HfON charge storage film contains the rhombohedral crystal by 1 at. % or less. When the nitrogen content of the HfON charge storage film is greater than 5 at. %, the ratio of the rhombohedral crystal increases. Note that since the crystallinity of the monoclinic crystal is low due to the complex structure so that the intensity of diffraction peak of the monoclinic crystal is small, even if a small ratio of the rhombohedral crystal (pseudo-cubic crystal) is contained, it is seen that the content ratio of the rhombohedral crystal is large.

Then, as shown in FIGS. 9 and 10, when the nitrogen content of the HfON charge storage film is set to 9.3 at. %, it was turned out that the HfON charge storage film is almost constituted from the $Hf_7O_{11}N_2$ crystal belonging to rhombohedral space group No. 148, -R3. In this case, it is considered that the HfON charge storage film is configured so as to contain the Bevan clusters and the fluorite $Hf_7O_{14}$ clusters with no defect which are stacked in layer at the ratio of 1:1. Therefore, the anion defect sites of the Bevan clusters are blocked by the fluorite $Hf_7O_{14}$ clusters with no defect so that charges can be trapped at the anion defect sites effectively and thus, the charge storage performance of the HfON charge storage film can be enhanced.

When the nitrogen content of the HfON charge storage film is set to 13.3 at. % greater than 9 at. %, the crystal structure of the HfON charge storage film is composed from the mixture of the $Hf_7O_{11}N_2$ crystal and the $Hf_7O_8N_4$ crystal belonging to rhombohedral space group No. 148, -R3, which is originated from that the ratio of the Bevan cluster to the fluorite $Hf_7O_{14}$ cluster increases as the nitrogen content increases. In this case, the crystal structure belonging to rhombohedral space group No. 148, -R3 and the crystal structure belonging to rhombohedral space group No. 147, -P3 occur alternately and discretely with the discrete change of the nitrogen content. Under no discrete change of the nitrogen content, it is considered that the HfON charge storage film is constituted from the mixture of the crystal structure belonging to rhombohedral space group No. 148, -R3 and the crystal structure belonging to rhombohedral space group No. 147, -P3.

Therefore, when the nitrogen content of the HfON charge storage film increases to 13.3 at. % from 9 at. %, the ratio of the Bevan cluster with anion defect site belonging to rhombohedral space group No. 148, -R3 increases and the ratio of the fluorite $Hf_7O_{14}$ cluster decreases. As a result, since the anion defect sites in the Bevan clusters are located in the vicinity of one another, the electron conduction barrier for the charges (electrons) trapped at the anion defect sites in the Bevan clusters decreases so that the charge storage performance decreases.

Accordingly, in the semiconductor memory element with the HfON charge storage film, only if the nitrogen content of the HfON charge storage film is set within a range of 5 to 13 at. % so that the HfON charge storage film can contain the mixture of the $Hf_7O_{11}N_2$ crystal and $Hf_7O_8N_4$ crystal belonging to rhombohedral space group No. 148, -R3, the semiconductor memory element with the HfON charge storage film can exhibit a large charge storage density and thus, the memory capacity of the semiconductor memory element can be enhanced. The $Hf_7O_{11}N_2$ crystal and $Hf_7O_8N_4$ crystal can be typically represented by the $Hf_7O_{2(4n+3)}/nN_{4(n-1)/n}$ (n: a natural number greater than or equal to two) crystal belonging to rhombohedral space group No. 148, -R3 or rhombohedral space group No. 147, -P3 as described previously. Only if the nitrogen content of the HfON charge storage film is set within a range of 9 to 11 at. % so that the HfON charge storage film can contain the $Hf_7O_{11}N_2$ crystal belonging to rhombohedral space group No. 148, -R3, the semiconductor memory element with the HfON charge storage film can exhibit a larger charge storage density and thus, the memory capacity of the semiconductor memory element can be much enhanced.

Although the present invention was described in detail with reference to the above examples, this invention is not limited to the above disclosure and every kind of variation and modification may be made without departing from the scope of the present invention.

In the embodiment, the combination of the silicon substrate and the SiON tunnel insulating film is employed, another combination may be employed. Since the SiON tunnel insulating film can function as an underlayer for the HfON charge storage film, the HfON charge storage film can be formed by means of sputtering or the like under no thermal treatment.

What is claimed is:

1. A semiconductor memory element, comprising:
a tunnel insulating film formed on a semiconductor substrate;
a HfON charge storage film with Bevan clusters formed on said tunnel insulating film;
a blocking film formed on said HfON charge storage film; and
a gate electrode formed on said blocking film.

2. The memory element as set forth in claim 1,
wherein said HfON charge storage film contains crystals belonging to at least one of rhombohedral space group No. 148, -R3 and rhombohedral space group No. 147, -P3.

3. The memory element as set forth in claim 1,
wherein said HfON charge storage film contains a chain structure of —V-M-V—C—V-M-V—C—V-M-V—C— . . . formed linearly so as to connect two anion defect sites in said Bevan clusters (herein, the symbol "V" designates a no anion site and the symbol "M" designates a cation site, and the symbol "C" designates a center site with no cation).

4. The memory element as set forth in claim 2,
wherein said HfON charge storage film contains fluorite $Hf_7O_{14}$ clusters so as to be configured such that said Bevan cluster and said fluorite $Hf_7O_{14}$ clusters are alternately stacked in layers.

5. The memory element as set forth in claim 4,
wherein said HfON charge storage film contains a chain structure of —V-M-V—C—S-M-S—C— . . . formed linearly so as to connect two anion defect sites in said Bevan clusters (herein, the symbol "V" designates a no anion site and the symbol "M" designates a cation site and the symbol "C" designates a center site with no cation and the symbol "S" designates an anion site).

6. The memory element as set forth in claim 1,
wherein a nitrogen content of said HfON charge storage film is set within a range of 0.5 to 21 at. %.

7. The memory element as set forth in claim 6,
wherein said nitrogen content of said HfON charge storage film is set within a range of 5 to 13 at. %.

8. The memory element as set forth in claim 7,
wherein said nitrogen content of said HfON charge storage film is set within a range of 9 to 11 at. %.

9. The memory element as set forth in claim 1,
wherein said semiconductor substrate is a silicon substrate and said tunnel insulating film is a SiON tunnel insulating film.

10. The memory element as set forth in claim 9,
further comprising a $Hf_xSi_{1-x}ON$ film (0<X<1) formed between said SiON tunnel insulating film and said HfON charge storage film so that a Hf component and a nitrogen component of said $Hf_xSi_{1-x}ON$ film increase to said HfON charge storage film from said SiON tunnel insulating film.

11. The memory element as set forth in claim 9,
wherein said SiON tunnel insulating film contains Hf elements.

12. The memory element as set forth in claim 9,
wherein said Hf elements are contained in said SiON tunnel insulating film through thermal diffusion by heating said HfON charge storage film at 950° C. or more.

13. A semiconductor memory element, comprising:
a tunnel insulating film formed on a semiconductor region;
a HfON charge storage film with Bevan clusters formed on said tunnel insulating film;
a blocking film formed on said HfON charge storage film; and
a gate electrode formed on said blocking film.

14. The memory element as set forth in claim 13,
wherein said HfON charge storage film contains crystals belonging to at least one of rhombohedral space group No. 148, -R3 and rhombohedral space group No. 147, -P3.

15. The memory element as set forth in claim 13,
wherein said HfON charge storage film contains a chain structure of —V-M-V-C-V-M-V-C-V-M-V-C—... formed linearly so as to connect two anion defect sites in said Bevan clusters (herein, the symbol "V" designates a no anion site and the symbol "M" designates a cation site, and the symbol "C" designates a center site with no cation).

16. The memory element as set forth in claim 14,
wherein said HfON charge storage film contains fluorite $Hf_7O_{14}$ clusters so as to be configured such that said Bevan cluster and said fluorite $Hf_7O_{14}$ clusters are alternately stacked in layers.

17. The memory element as set forth in claim 16,
wherein said HfON charge storage film contains a chain structure of —V-M-V-C-S-M-S-C—... formed linearly so as to connect two anion defect sites in said Bevan clusters (herein, the symbol "V" designates a no anion site and the symbol "M" designates a cation site and the symbol "C" designates a center site with no cation, and the symbol "S" designates an anion site).

18. The memory element as set forth in claim 13,
wherein a nitrogen content of said HfON charge storage film is set within a range of 0.5 to 21 at.%.

19. The memory element as set forth in claim 18,
wherein said nitrogen content of said HfON charge storage film is set within a range of 5 to 13 at.%.

20. The memory element as set forth in claim 19,
wherein said nitrogen content of said HfON charge storage film is set within a range of 9 to 11 at.%.

21. The memory element as set forth in claim 13,
wherein said semiconductor region is a region and said tunnel insulating film is a SiON tunnel insulating film.

22. The memory element as set forth in claim 21,
further comprising a $Hf_xSi_{1-x}ON$ film (0<X<1) formed between said SiON tunnel insulating film and said HfON charge storage film so that a Hf component and a nitrogen component of said $Hf_xSi_{1-x}ON$ film increase to said HfON charge storage film from said SiON tunnel insulating film.

23. The memory element as set forth in claim 21,
wherein said SiON tunnel insulating film contains Hf elements.

24. The memory element as set forth in claim 21,
wherein said Hf elements are contained in said SiON tunnel insulating film through thermal diffusion by heating said HfON charge storage film at 950° C. or more.

* * * * *